(12) United States Patent
Yamane

(10) Patent No.: US 6,987,323 B2
(45) Date of Patent: Jan. 17, 2006

(54) CHIP-SIZE SEMICONDUCTOR PACKAGE

(75) Inventor: Tae Yamane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 70 days.

(21) Appl. No.: 10/062,426

(22) Filed: Feb. 5, 2002

(65) Prior Publication Data

US 2003/0146504 A1 Aug. 7, 2003

(51) Int. Cl.
*H01L 23/48* (2006.01)
*H01L 23/52* (2006.01)
*H01L 29/40* (2006.01)

(52) U.S. Cl. .................... 257/775; 257/773; 257/784; 257/786; 257/737; 257/738; 257/780; 257/690; 257/787

(58) Field of Classification Search .............. 257/775, 257/773, 784, 690, 786, 737, 738, 780, 787
See application file for complete search history.

(56) References Cited

U.S. PATENT DOCUMENTS

| | | | | |
|---|---|---|---|---|
| 5,220,199 A | * | 6/1993 | Owada et al. ............ 257/773 |
| 5,289,036 A | * | 2/1994 | Nishimoto ............... 257/774 |
| 5,844,317 A | * | 12/1998 | Bertolet et al. .......... 257/733 |
| 5,886,414 A | * | 3/1999 | Galloway ................. 257/784 |
| 6,198,165 B1 | * | 3/2001 | Yamaji et al. ............ 257/734 |
| 6,237,218 B1 | * | 5/2001 | Ogawa et al. ............. 29/830 |
| 6,313,541 B1 | * | 11/2001 | Chan et al. ............... 257/786 |
| 6,417,575 B2 | * | 7/2002 | Harada et al. ........... 257/784 |

FOREIGN PATENT DOCUMENTS

| JP | 402049429 | * | 2/1990 | ............ 21/320 |
|---|---|---|---|---|
| JP | 2000-183214 | * | 6/2000 | ............ 23/12 |

* cited by examiner

Primary Examiner—Nitin Parekh
(74) Attorney, Agent, or Firm—Volentine Francos & Whitt, PLLC

(57) ABSTRACT

A chip-size semiconductor package includes a semiconductor chip; a metal pad formed on the semiconductor chip; a conductive wiring pattern electrically connected to the metal pad; a molding resin formed over the conductive wiring pattern; and a terminal member which is electrically connected to the conductive wiring pattern, wherein the conductive wiring pattern comprises a termial portion on which the terminal member is formed, an extended portion extending from the terminal portion and a connecting portion arranged between the terminal portion and the extended portion. The portion connecting portion between the extended portion and the terminal portion is provided with a slit, to disperse stress applied to the connecting portion.

19 Claims, 9 Drawing Sheets

CHIP-SIZE SEMICONDUCTOR PACKAGE

TECHNICAL FIELD OF THE INVENTION

The present invention generally relates to a chip-size semiconductor package, and more particularly to a chip-size semiconductor package having a wiring layer in which stress applied thereto is effectively relaxed.

BACKGROUND OF THE INVENTION

Usually, a chip-size semiconductor package includes a Si chip; metal pads formed on the Si chip; a wafer coating formed over the Si chip; conductive wiring patterns formed on the wafer coating; a molding resin formed over the wafer coating; conductive posts formed in the molding resin; and terminals formed on the conductive posts. The conductive wiring patterns are electrically connected to the metal pads through the wafer coating. The terminals are connected to the conductive posts one by one.

According to the conventional chip-size package, a connecting portion (boundary portion) between the conductive post and wiring pattern is extremely narrow and weak. Therefore, the connecting portion may be broken by stress, which is generated when the molding resin is expanded or contracted.

According to another conventional chip-size semiconductor package, the connecting portion is shaped to decrease in area gradually from the conductive post to conductive wiring pattern. However, the area to be in contact with the molding resin is increased, so that the molding resin may be easily removed from the conductive post and conductive wiring pattern. As a result, the connecting portion may be broken later.

OBJECTS OF THE INVENTION

Accordingly, an object of the present invention is to provide a chip-size semiconductor package in which a connecting portion between a conductive post and a wiring pattern is not easily broken.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a chip-size semiconductor package includes a semiconductor chip; a metal pad formed on the semiconductor chip; a conductive wiring pattern electrically connected to the metal pad; a molding resin formed over the conductive wiring pattern; and a terminal member which is electrically connected to the conductive wiring pattern, wherein the conductive wiring pattern comprises a terminal portion on which the terminal member is formed, an extended portion extending from the terminal portion and a connecting portion arranged between the terminal portion and the extended portion. The connecting portion has a width that gradually decreases toward the extended portion, and the connecting portion has slit to disperse stress to be applied to the connecting portion.

Preferably, the connecting portion is provided with a plurality of slits, which are separated from each other. The slits may be shaped to be rectangular and arranged to extend radially.

According to a second aspect of the present invention, a chip-size semiconductor package includes a semiconductor chip; a metal pad formed on the semiconductor chip; a conductive wiring pattern electrically connected to the metal pad; a molding resin formed over the conductive wiring pattern; and a terminal member which is electrically connected to the conductive wiring pattern, wherein the conductive wiring pattern comprises a terminal portion on which the terminal member is formed, an extended portion extending from the terminal portion and a connecting portion arranged between the terminal portion and the extended portion, the connecting portion has a width that gradually decreases from a first boundary at the terminal portion to a second boundary at the extended portion, and a dummy pattern arranged adjacent the first and second boundaries and along sides of the connecting portion, the molding resin also being formed on the dummy pattern.

Preferably, the dummy pattern is a conductive pattern which is formed in the same process as the conductive wiring pattern and is arranged parallel to the conductive wiring pattern. Further, the dummy pattern may include two parts arranged at both sides of the conductive pattern. Furthermore, the two parts of the dummy pattern may be arranged along the conductive post and conductive wiring pattern.

According to a third aspect of the present invention, a chip-size semiconductor package includes a semiconductor chip; a metal pad formed on the semiconductor chip; semiconductor chip; a conductive wiring pattern electrically connected to the metal pad; a molding resin formed over the conductive wiring pattern; and a terminal member which is electrically connected to the conductive wiring pattern comprises a terminal portion on which the terminal member is formed, an extended portion extending from the terminal portion and a connecting portion arranged between the terminal portion and the extended portion, the connected portion has a width that gradually decreases from a first boundary at the terminal portion to a second boundary at the extended portion, and a dent is formed at and around the connecting portion.

The dent may be shaped to be square.

According to a fourth aspect of the present invention, a chip-size semiconductor package includes a semiconductor chip; a metal pad formed on the semiconductor chip; a conductive wiring pattern electrically connected to the metal pad; a molding resin formed over the conductive wiring pattern; and a terminal member which is electrically connected to the conductive wiring pattern, wherein the conductive wiring pattern comprises a terminal portion on which the terminal member is formed, an extended portion extending from the terminal portion and a connecting portion arranged between the terminal portion and the extended portion, the connecting portion has a width that gradually decreases from a first boundary at the terminal portion to a second boundary at the extended portion, and the connecting portion has a first region extending outwardly from the terminal portion and a second region extending from the connecting portion.

Preferably, the second region comprises a plurality of projecting parts each of which extends vertically from the first region, and the projecting parts of the second region are extended from both sides of the first region. At least one of the projecting parts may form a part of the connecting portion.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
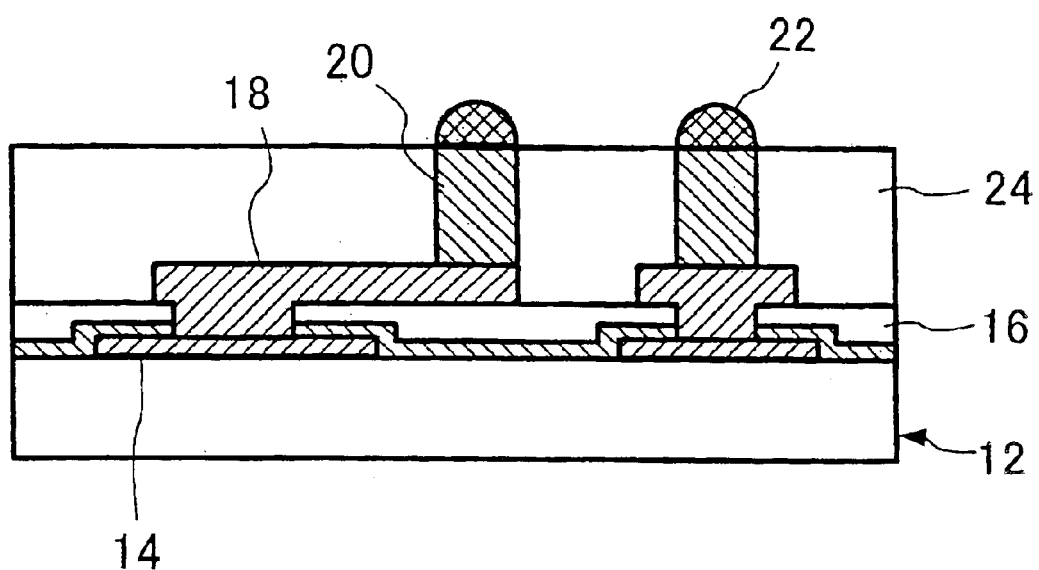
FIG. 1 is a cross-sectional view showing a conventional chip-size semiconductor package.
Figure 2:
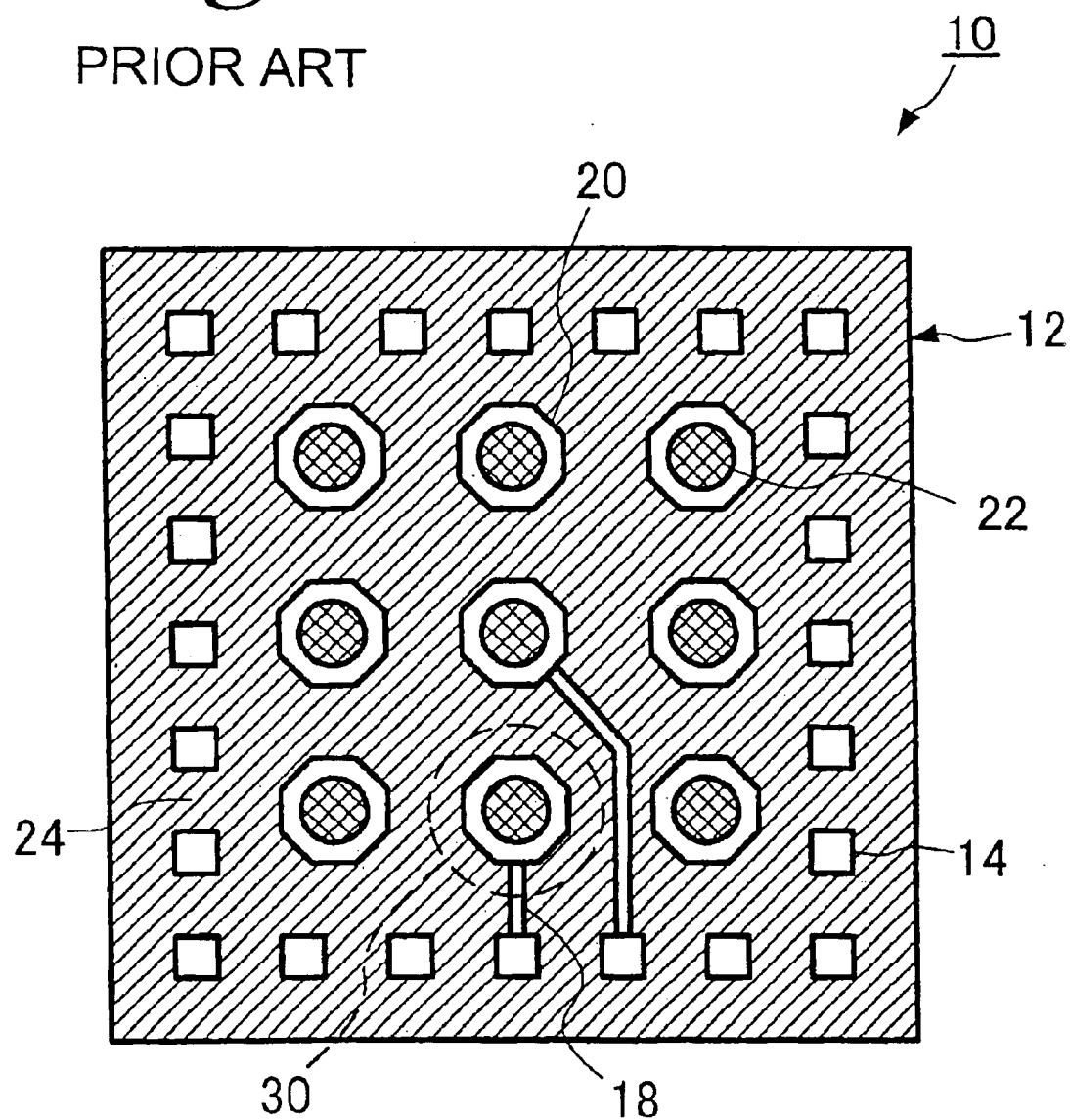
FIG. 2 is a plan view showing a conventional chip-size semiconductor package.

For better understanding of the present invention, a conventional technology is first described in conjunction with FIGS. 1 to 4. FIG. 1 is a cross-sectional view showing a conventional chip-size semiconductor package 10. FIG. 2 is a plan view showing the conventional chip-size semiconductor package 10, shown in FIG. 1. The chip-size semiconductor package 10 includes a Si chip 12; metal pads 14 formed on the Si chip 12; a wafer coating 16 formed over the Si chip 12; conductive wiring patterns 18 formed on the wafer coating 16 and including conductive portions 20A; a molding resin 24 formed over the wafer coating 16; conductive posts 20 formed in the molding resin 24 and on conductive portion 20A; and terminals 22 formed on the conductive posts 20A. The conductive wiring patterns 18 are electrically connected to the metal pads 14 through the wafer coating 16. The terminals 22 are connected to the conductive posts 20 one by one.

Figure 3:
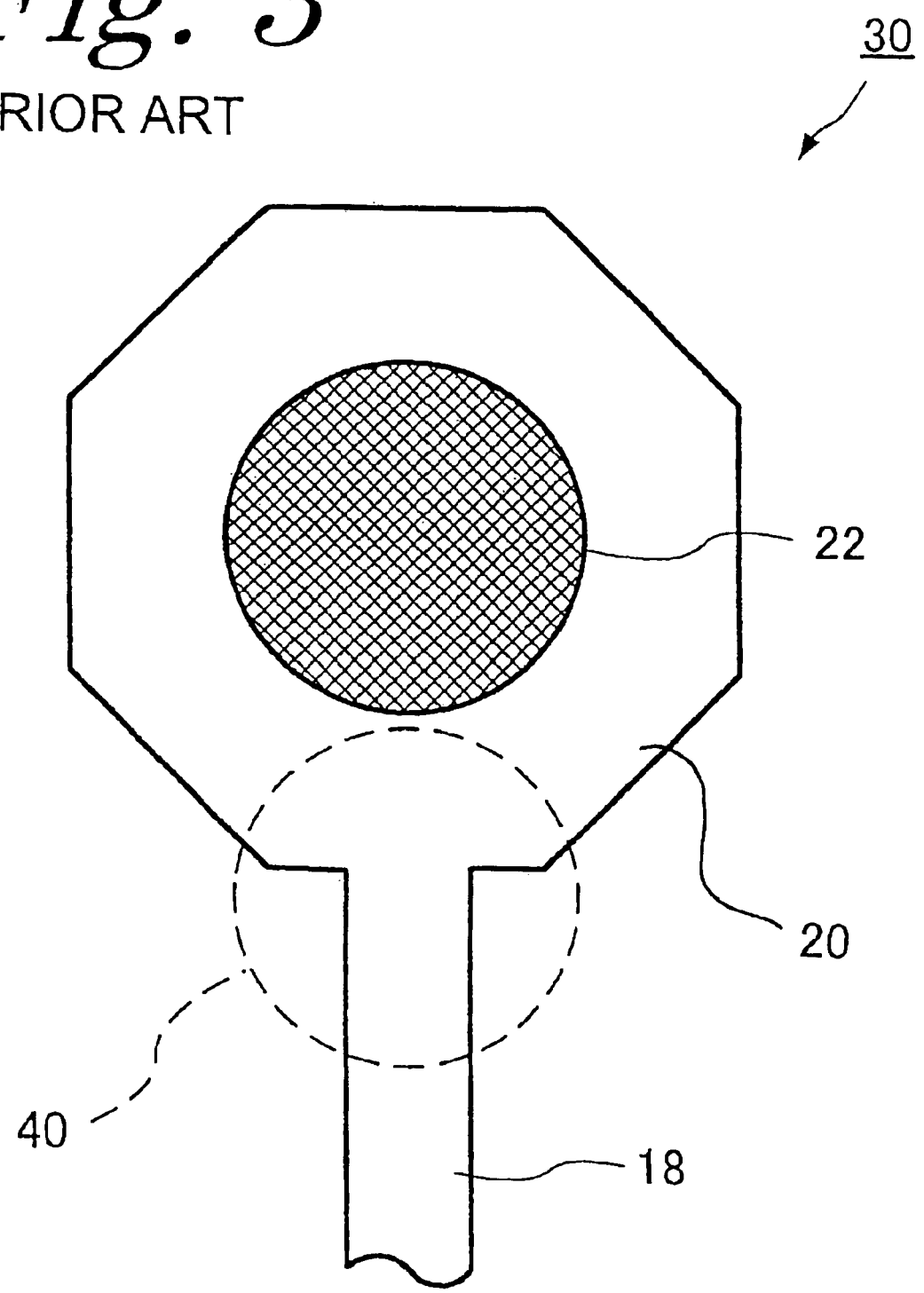
FIG. 3 is an enlarged view showing a part of the chip-size semiconductor package shown in FIG. 2.

FIG. 3 is an enlarged view showing a part 30 encircled by a broken line in FIG. 2. As shown in FIG. 3, a connecting portion (boundary portion) 40 between the conductive portion 20A and wiring pattern 18 is extremely narrow and weak. According to the conventional chip-size package, the connecting portion 40 may be broken by stress, which is generated when the molding resin 24 is expanded or contracted.

Figure 4:
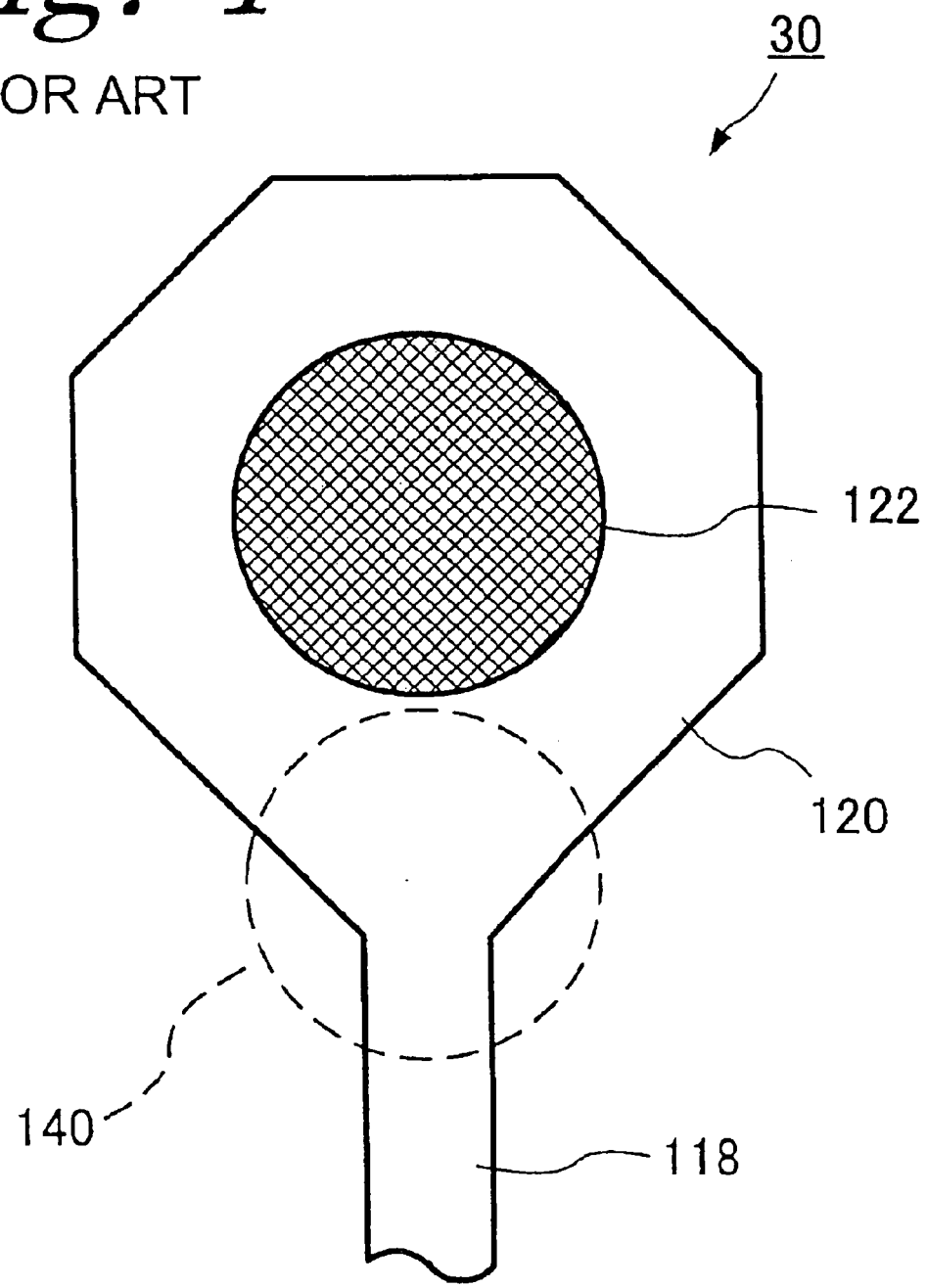
FIG. 4 is an enlarged view showing a part of another conventional chip-size semiconductor package.

FIG. 4 is an enlarged view showing the part 30 of another conventional chip-size semiconductor package. As described above, a connecting portion (boundary portion) 140 is a part which is easily broken in response to stress, so that the connecting portion 140 is shaped to decrease in area gradually from the conductive portion 120A to a conductive wiring pattern 118.

However, according to the chip-size semiconductor package, shown in FIG. 4, the area to be in contact with the molding resin 24 is increased, so that the molding resin 24 may be removed from the conductive portion 120A and conductive wiring pattern 118. As a result, the connecting portion 140 may be broken easily.

Hereafter, a preferred embodiment of the present invention is described in detail with reference to FIGS. 5 to 9.

Figure 5:
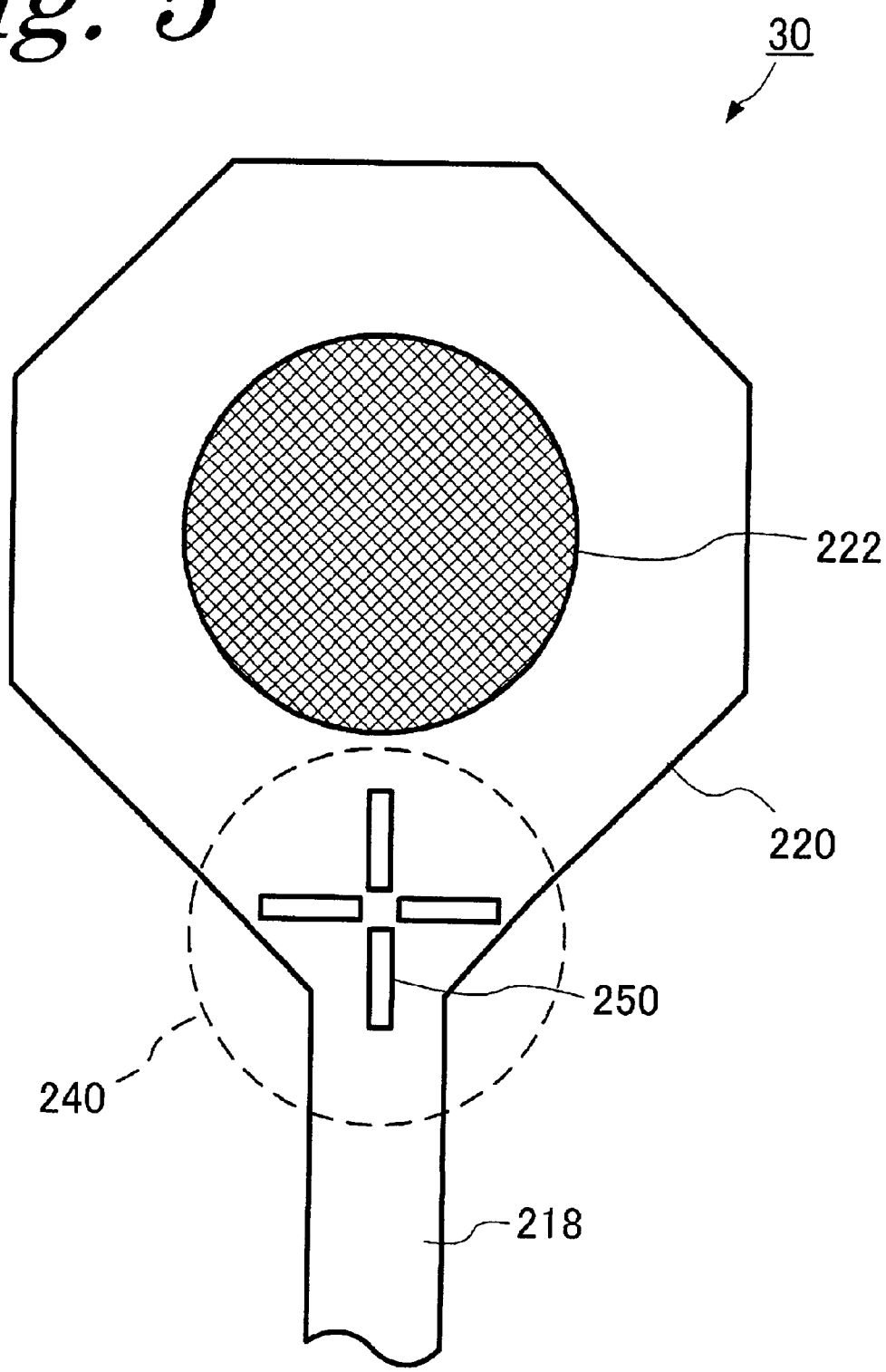
FIG. 5 is an enlarged view showing a part of a chip-size semiconductor package according to a first preferred embodiment of the present invention.

FIG. 5 is an enlarged view showing the part 30 of a chip-size semiconductor package according to a first preferred embodiment of the present invention. According to the first preferred embodiment, a connecting portion (boundary portion) 240 of a conductive wiring pattern 218 and a conductive portion 220A is provided with four slits 250 to disperse stress to be applied to the connecting portion 240. The connecting portion 240 is a part which is easily broken in response to stress, so that the connecting portion 240 is shaped to decrease in area gradually from the conductive portion 220A to the conductive wiring pattern 218.

The slits 250 are arranged to be separated by a predetermined distance from each other. The slits 250 are shaped to be rectangular and arranged to extend radially, as shown in FIG. 5. According to the first preferred embodiment, the slits 250 are provided, so that stress applied to the connecting portion 240 is dispersed, and the molding resin is well in contact or bonded with the conductive portion 220A and conductive wiring pattern 218. As a result, the connecting portion 240 is not easily broken.

Figure 6:
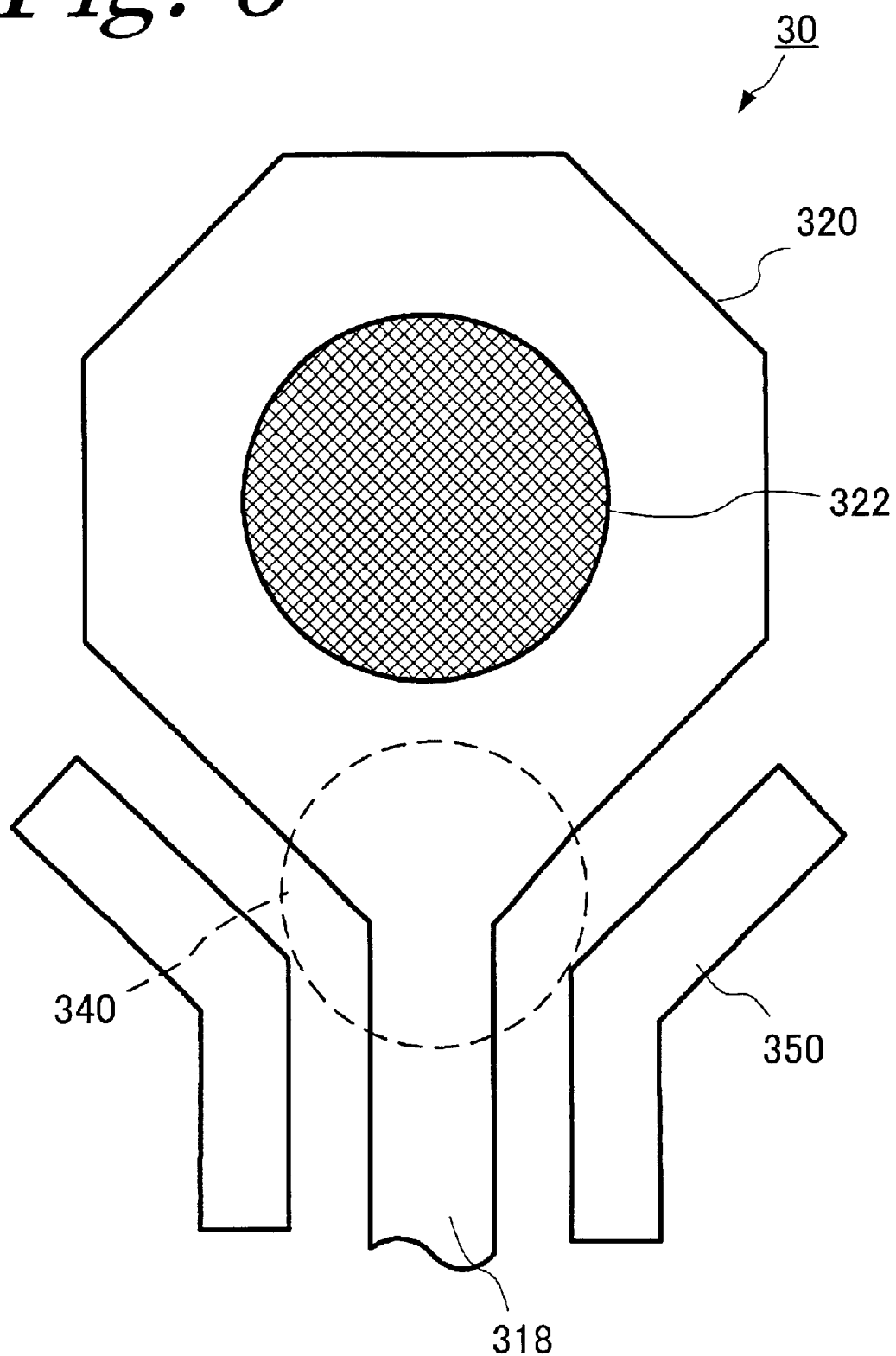
FIG. 6 is an enlarged view showing a part of a chip-size semiconductor package according to a second preferred embodiment of the present invention.

FIG. 6 is an enlarged view showing the part 30 of a chip-size semiconductor package according to a second preferred embodiment of the present invention. According to the second preferred embodiment, dummy pattern 350 is formed around a connecting portion (boundary portion) 340 of a conductive wiring pattern 318 and a conductive portion 320A. The dummy patterns 350 are arranged along the shape of the connecting portion 340. The connecting portion 340 is a part which is easily broken in response to stress, so that the connecting portion 340 is shaped to decrease in area gradually from the conductive portion 320A to the conductive wiring pattern 318.

The dummy patterns 350 are of conductive patterns which are formed in the same process as the conductive wiring pattern 318 and are arranged parallel to the conductive wiring pattern 318.

According to the second preferred embodiment, the dummy patterns 350 are provided, so that stress applied to the connecting portion 340 is dispersed, and the molding resin is well in contact or bonded with the conductive portion 320A and conductive wiring pattern 318. As a result, the connecting portion 340 is not easily broken.

Figure 7:
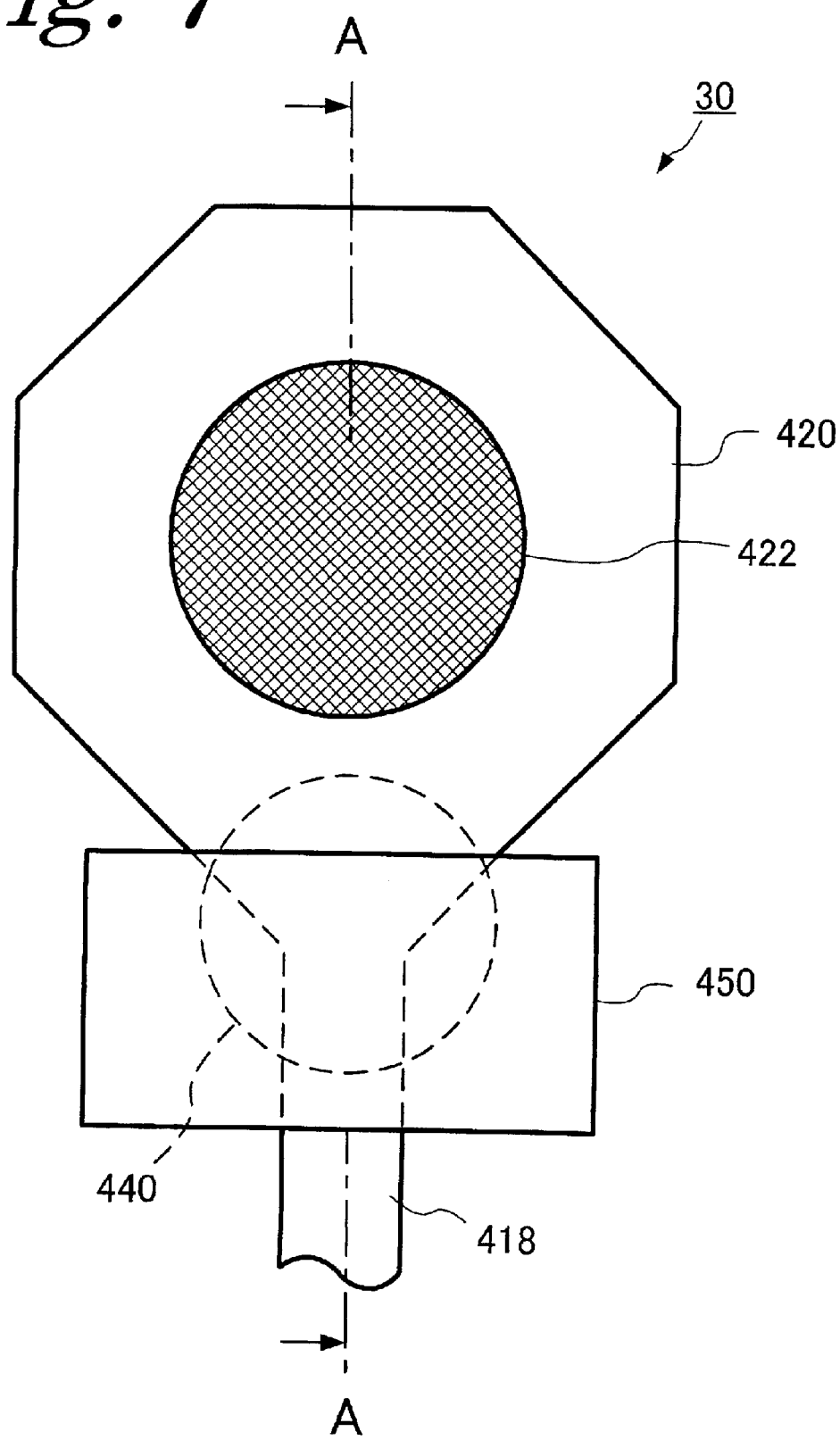
FIG. 7 is an enlarged view showing a part of a chip-size semiconductor package according to a third preferred embodiment of the present invention.
Figure 8:
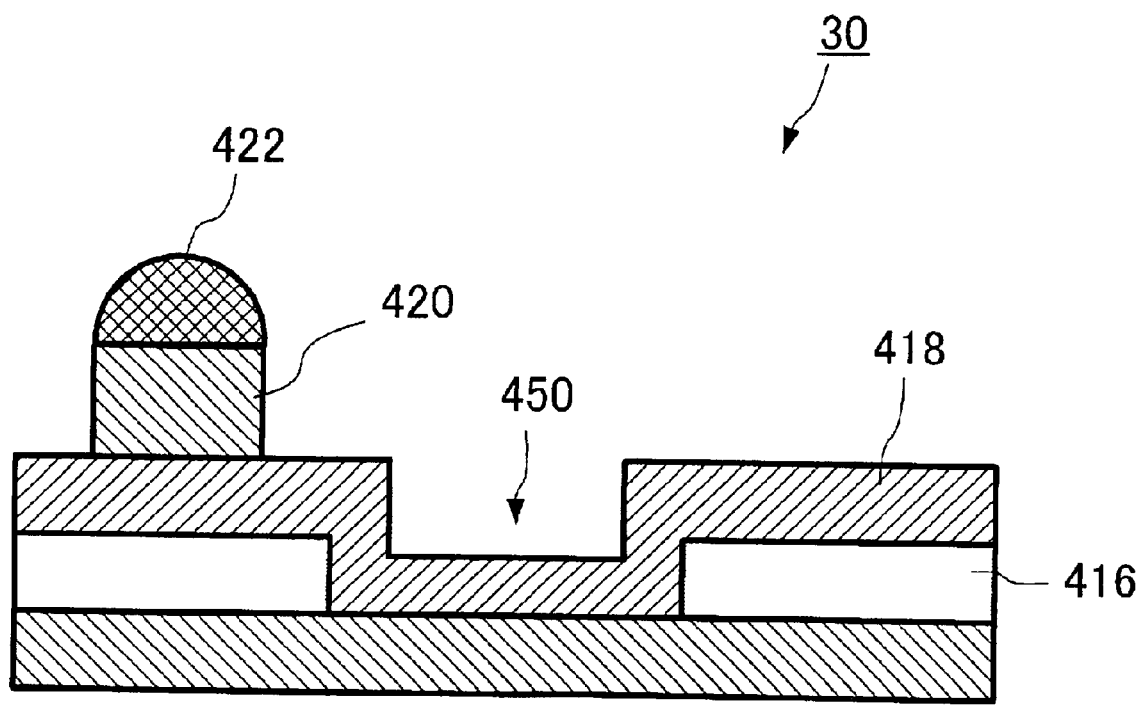
FIG. 8 is a cross-sectional view taken on line A—A in FIG. 7.

FIG. 7 is an enlarged view showing a part of a chip-size semiconductor package according to a third preferred embodiment of the present invention. FIG. 8 is a cross-sectional view taken on line A—A in FIG. 7. According to the third preferred embodiment, a dent 450 is formed around a connecting portion (boundary portion) 440 of a conductive wiring pattern 418 and a conductive portion 420A. The connecting portion 440 is a part which is easily broken in response to stress, so that the connecting portion 440 is shaped to decrease in area gradually from the conductive portion 420A to the conductive wiring pattern 418. The dent 450 is shaped to be square.

According to the third embodiment, the dent 450 is formed around the connecting portion 440, so that stress applied to the connecting portion 440 is dispersed, and the molding resin is well in contact or bonded with the conductive portion 420A and conductive wiring pattern 418. As a result, the connecting portion 440 is not easily broken.

Figure 9:
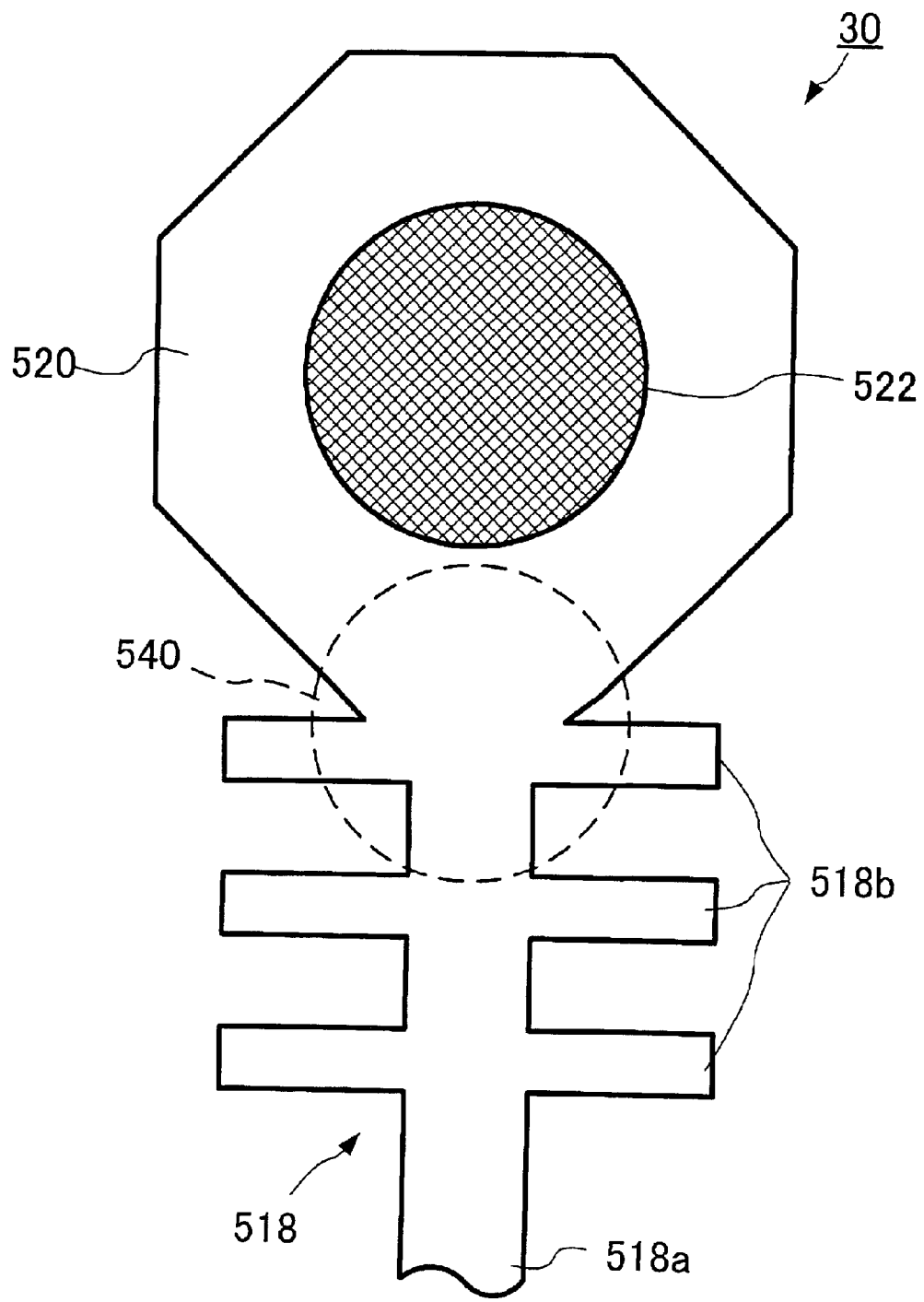
FIG. 9 is an enlarged view showing a part of a chip-size semiconductor package according to a fifth preferred embodiment of the present invention.

FIG. 9 is an enlarged view showing a part of a chip-size semiconductor package according to a fourth preferred embodiment of the present invention. According to the fourth preferred embodiment, a conductive wiring pattern 518 is shaped to have a first region 518a extending outwardly from a conductive portion 520A and second regions 518b each of which is extending or projecting perpendicularly from the first region 518a. The projecting parts of the second region 518b are extended from both sides of the first region 518a. One horizontal line of the projecting parts 518b forms a part of the conductive portion 520A.

The connecting portion 540 is a part which is easily broken in response to stress, so that the connecting portion 540 is shaped to decrease in area gradually from the conductive portion 520A to the conductive wiring pattern 518.

According to the fourth embodiment, the conductive wiring pattern 518 is shaped to have the first region 518a and second regions 518b extending perpendicularly from the first region 518a, so that stress applied to the connecting portion 540 is dispersed, and the molding resin is well in contact or bonded with the conductive portion 520A and conductive wiring pattern 518. As a result, the connecting portion 540 is not easily broken.

What is claimed is:

1. A chip-size semiconductor package, comprising:
   a semiconductor chip;
   a metal pad formed on the semiconductor chip;
   a conductive wiring pattern electrically connected to the conductive metal pad;
   a molding resin formed over the conductive wiring pattern; and
   a terminal member which is electrically connected to the conductive wiring pattern, wherein
   the conductive wiring pattern comprises a terminal portion on which the terminal member is formed, an extended portion extending from the terminal portion and a connecting portion arranged between the terminal portion and the extended portion,
   the connecting portion has a width that gradually decreases toward the extended portion, and
   the connecting portion has a slit to disperse stress to be applied to the connecting portion.

2. A chip-size semiconductor package according to claim 1, wherein the connecting portion is provided with a plurality of slits, which are separated from each other.

3. A chip-size semiconductor package according to claim 2, wherein the slits are rectangular shaped and are arranged to extend radially away from each other.

4. A chip-size semiconductor package according to claim 1, further comprising a wafer coat formed over the semiconductor chip, wherein the conductive wiring pattern is formed on the wafer coat.

5. A chip-size semiconductor package according to claim 1, wherein the terminal member comprises a conductive post that is arranged on the terminal portion, and a terminal that is formed on the conductive post and exposed from the molding resin.

6. A chip-size semiconductor package, comprising:
   a semiconductor chip;
   a metal pad formed on the semiconductor chip;
   a conductive wiring pattern electrically connected to the metal pad;
   a molding resin formed over the conductive wiring pattern; and
   a terminal which is electrically connected to the conductive wiring pattern, wherein
   the conductive wiring pattern comprises a terminal portion on which the terminal member is formed, an extended portion extending from the terminal portion and a connecting portion arranged between the terminal portion and the extended portion,
   the connecting portion has a width that gradually decreases from a first boundary at the terminal portion to a second boundary at the extended portion, and
   a dummy pattern arranged adjacent the first and second boundaries and along sides of the connecting portion, the molding resin also being formed on the dummy pattern.

7. A chip-size semiconductor package according to claim 6, wherein the dummy pattern is a conductive pattern which is formed during a same process as the conductive wiring pattern and is arranged paprallel to the conductive wiring pattern.

8. A chip-size semiconductor package accroding to claim 6, wherein the dummy pattern comprises two parts respectively arranged along both sides of the connecting portion.

9. A chip-size semiconductor package according to claim 6, further comprising a wafer coast formed over the semicoductor chip, wherein the conductive wiring pattern is formed on the wafer coat.

10. A chip-size semiconductor package according to claim 6, wherein the terminal member comprises a conductive post that is arranged on the terminal portion, and a terminal that is formed on the conductive post and exposed from the molding resin.

11. A chip-size semiconductor package, comprising:
    a semiconductor chip;
    a metal pad formed on the semiconductor chip;
    a conductive wiring pattern electrically connected to the metal pad;
    a molding resin formed over the conductive wiring pattern; and
    a terminal member which is electrically connected to the conductive wiring pattern, wherein
    the conductive wiring pattern comprises a terminal portion on which the terminal member is formed, an extended portion extending from the terminal portion and a connecting portion arranged between the terminal portion and the extended poriton.
    the connecting portion has a width that gradually decreases from a first boundary at the terminal portion to a second boundary at the extended portion, and
    a dent is formed at and around the connecting portion.

12. A chip-size semiconductor package according to claim 11, wherein the dent is square shaped.

13. A chip-size semiconductor package according to claim 11, further comprising a wafer coat formed over the semiconductor chip, wherein the conductive wiring pattern is formed on the wafer coat.

14. A chip-size semiconductor package according to claim 11, wherein the terminal member comprises a conductive post that is arranged on the terminal portion, and a terminal that is formed on the conductive post and exposed from the molding resin.

15. A chip-size semiconductor package, comprising;
    a semiconductor chip;
    a metal pad formed on the semiconductor chip;

a conductive wiring pattern electrically connected to the metal pad;

a molding resin formed over the conductive wiring pattern; and a terminal member which is electrically connected to the conductive wiring pattern, wherein the conductive wiring pattern comprises a terminal portion on which the terminal member is formed, an extended portion extending from the terminal portion and a connecting portion arranged between the terminal portion and the extended poriton, the connecting portion has a width that gradually decreases from a first boundary at the terminal portion to a second boundary at the extended portion, and the connecting portion has a first region extending outwardly from the terminal portion and a second region extending in a perpendicular direction from the first region, the second region extending from the connecting portion.

16. A chip-size semiconductor package according to claim 15, further comprising a plurality of projecting parts each of which extends in the perpendicular direction from the conductive wiring pattern.

17. A chip-size semiconductor package according to claim 16, wherein the second region extends from both sides of the first region.

18. A chip-size semiconductor package according to claim 15, further comprising a wafer coat formed over the semiconductor chip, wherein the conductive wiring pattern is formed on the wafer coat.

19. A chip-size semiconductor package according to claim 15, wherein the terminal member comprises a conductive post that is arranged on the terminal portion, and a terminal that is formed on the conductive post and exposed from the molding resin.

* * * * *